(12) United States Patent
Moriguchi et al.

(10) Patent No.: US 7,301,342 B2
(45) Date of Patent: Nov. 27, 2007

(54) BUNCHED PHASE ENCODING (BPE)

(75) Inventors: Hisamoto Moriguchi, Cleveland, OH (US); Jeffrey L. Sunshine, Cleveland, OH (US); Jeffrey L. Duerk, Cleveland, OH (US)

(73) Assignee: Case Western Reserve University, Cleveland, OH (US)

( * ) Notice: Subject to any disclaimer, the term of this patent is extended or adjusted under 35 U.S.C. 154(b) by 228 days.

(21) Appl. No.: 11/106,870

(22) Filed: Apr. 15, 2005

(65) Prior Publication Data

US 2006/0247515 A1    Nov. 2, 2006

(51) Int. Cl.
*G01V 3/00* (2006.01)
(52) U.S. Cl. .................................. 324/309; 324/307
(58) Field of Classification Search ............. 324/309, 324/307
See application file for complete search history.

(56) References Cited

U.S. PATENT DOCUMENTS

| 5,570,018 | A  | * | 10/1996 | Halse ......................... 324/309 |
| 5,608,322 | A  | * | 3/1997  | Lonergan et al. ........... 324/309 |
| 6,549,008 | B1 | * | 4/2003  | Anand et al. ............... 324/307 |
| 6,731,112 | B2 | * | 5/2004  | Ruppert ...................... 324/307 |

* cited by examiner

*Primary Examiner*—Louis M. Arana
(74) *Attorney, Agent, or Firm*—John T. Kalnay

(57) ABSTRACT

Systems, methodologies, media, and other embodiments associated with improving MRI scan times and mitigating the effects of aliasing artifacts when the Nyquist data sampling threshold is not satisfied are described. One exemplary method embodiment includes producing an oscillating phase encoding gradient during a readout phase, where the gradient facilitates acquiring data from multiple phase encoding lines during a single readout phase. The exemplary method embodiment may also include reconstructing an image from the data acquired from two or more phase encoding lines.

19 Claims, 10 Drawing Sheets

BUNCHED PHASE ENCODING (BPE)

This invention was made with government support under Federal Grants R01 CA81431 and R33 CA88144 awarded by the NIH. The government has certain rights in the invention.

COPYRIGHT NOTICE

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND

In rectilinear MRI (Magnetic Resonance Imaging) acquisition, k-space data are typically acquired while a constant amplitude read gradient is applied. This results in a straight line trajectory during data sampling intervals. For example, in FIG. 2, the five straight lines of black dots 210 represent five sampling trajectories used to sample k-space data points using conventional rectilinear acquisition. In this type of rectilinear acquisition, the scan time is equal to TR (repetition time) times the number of phase encoding lines. For example, on the left side of FIG. 2, data is acquired using five read gradients and thus the acquisition time would be TR times five. In this conventional system, attempts to reduce scan time have included reducing the number of read phases by increasing the phase encoding step size. However, these approaches have typically lead to aliasing artifacts.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
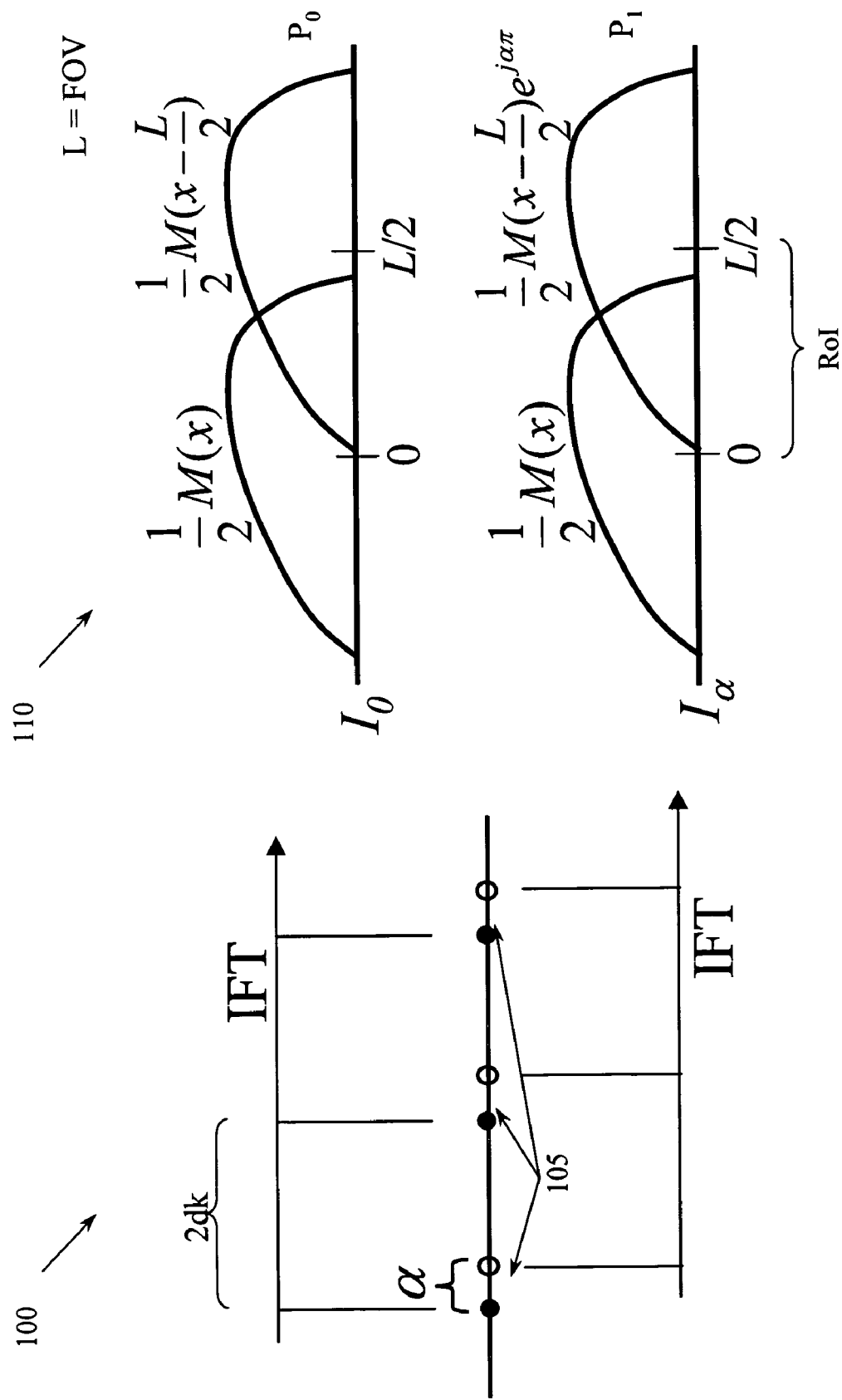
FIG. 1 illustrates concepts associated with BPE acquisition.

Example systems and methods described herein employ a bunched phase encoding (BPE) technique to reduce magnetic resonance imaging (MRI) scan times. The example systems and methods facilitate increasing scan time efficiency by acquiring data from multiple phase encoding lines per readout. The example systems and methods also facilitate mitigating issues associated with aliasing artifacts related to not satisfying the Nyquist sampling threshold.

In a magnetic field, the intrinsic angular momentum, referred to as "spin", of a nucleus (e.g., hydrogen nucleus, "proton") precesses about the field at the Larmor frequency. The Larmor frequency for the nucleus depends linearly on the magnitude of the magnetic field. Thus, if a spatially varying magnetic field is provided across the object, the Larmor frequencies for nuclei in the object will vary spatially in relation to the spatially varying magnetic field. The magnetic field is commonly referred to as $B_0$. Acquiring images of humans, animals, and the like depends on being able to manipulate the bulk precession of spins in organic molecules like water, fat, and so on using a combination of magnetic fields.

Precession is defined as the circular motion of the axis of rotation of a spinning body about another fixed axis where the circular motion is caused by applying a torque in the direction of the precession. With respect to a proton in a magnetic field, the magnetic field and the spin of the proton produce the torque, causing the proton to precess about the fixed axis of the magnetic field. An object like a body contains a large number of protons. The magnetic moment vector density attributable to the spin population associated with this large number of protons may be referred to as a magnetization vector. In MRI, the magnetization vector may be tipped away from the axis of an external field $B_0$ in order to cause it to begin precessing. When tipped away, the aggregate proton spins may produce a new magnetic field. This new magnetic field will precess along with the magnetization vector and thus may yield a changing flux in a receiving coil. Typically, the magnetization vector is rotated away from alignment along the axis of the $B_0$ field by applying a radio frequency (RF) pulse. The RF pulse is tuned to the Larmor frequency.

The new (e.g., resulting) magnetic field may yield a transverse magnetization that has a magnitude $M_0$. In one example, the transverse magnetization may begin to precess in the x-y plane if the $B_0$ field was directed along the z axis and the RF pulse tipped the magnetization vector ninety degrees into the x-y plane. In this case, the magnetization can be described in terms of the magnitude of the phase (polar angle) according to:

$$M_+(t)=M_x(t)+iM_y(t)=M_0 e^{-iw_0 t+i\phi_0} \quad \text{[Equation 1]}$$

Thus, it is to be appreciated that the phase angle describes the direction in the x-y plane of the resulting two dimensional transverse magnetization vector. An initial phase $\phi_0$ may depend on the rotational axis of the initial rotation into the transverse plane.

In rectilinear MRI acquisition, k-space data are typically acquired while a constant amplitude read gradient is applied and no gradient along the phase encoding direction is applied. In BPE, an oscillating phase encoding gradient may be applied during readout. This may facilitate acquiring data from more than one phase encoding line per readout.

Figure 4:
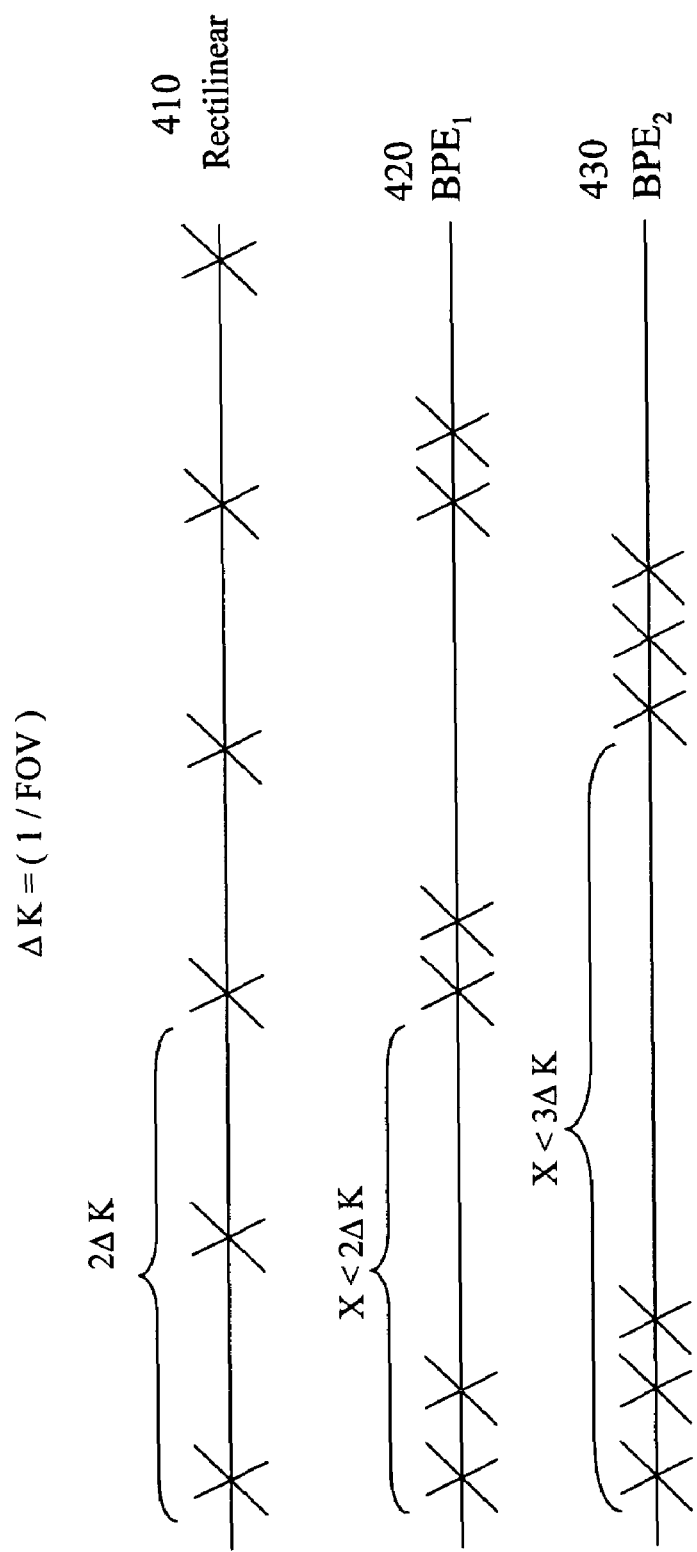
FIG. 4 illustrates concepts associated with BPE acquisition and conventional rectilinear acquisition.

In some cases, images that are free of aliasing artifacts can be reconstructed even if the Nyquist criterion is not satisfied for some regions of the Fourier domain. For example, if m bunched samples are acquired at $1/m^{th}$ the Nyquist rate in the Fourier domain, it is possible to reconstruct images without aliasing artifacts using example systems and methods described herein. In FIG. 1, the sets of paired black dots and white dots 105 represent one example of bunched samples that may be acquired using BPE. Similarly, FIG. 4 illustrates sets of samples that may be acquired using BPE.

BPE provides a method that facilitates reducing the number of repetitions (TR) for a scan by facilitating acquiring data from more than one phase encoding line per readout. Applying an oscillating phase encoding gradient during readout allows data from more than one phase encoding line to be acquired during each readout. For example, FIG. 3 illustrates how data from multiple phase encoding lines may be acquired by using an oscillating phase encoding gradient. Since more data is acquired per readout than is typical in conventional systems, the total number of TR cycles may be reduced and thus, in turn, the total MR scan time may be reduced. For example, in FIG. 2, while a conventional rectilinear system using trajectories 210 would require five TRs to cover the sample data space, the example BPE system using trajectories 220 would only require three TRs to cover the same sample data space.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, volatile media, and transmission media. Non-volatile media may include, for example, optical or magnetic disks, and so on. Volatile media may include, for example, optical or magnetic disks, dynamic memory and the like. Transmission media may include coaxial cables, copper wire, fiber optic cables, and the like. Transmission media can also take the form of electromagnetic radiation, like that generated during radio-wave and infra-red data communications, or take the form of one or more groups of signals. Common forms of a computer-readable medium include, but are not limited to, a floppy disk, a flexible disk, a hard disk, and other media from which a computer, a processor or other electronic device can read. Signals used to propagate instructions or other software over a network, like the Internet, can be considered a "computer-readable medium."

"Data store", as used herein, refers to a physical and/or logical entity that can store data. A data store may be, for example, a database, a table, a file, a list, a queue, a heap, a memory, a register, and so on. A data store may reside in one logical and/or physical entity and/or may be distributed between two or more logical and/or physical entities.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like an application specific integrated circuit (ASIC), a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical and/or physical communication channels can be used to create an operable connection.

"Software", as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically and/or statically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated by one of ordinary skill in the art that the form of software may depend, for example, on requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

Suitable software for implementing the various components of the example systems and methods described herein may be produced using programming languages and tools like Java, Pascal, C#, C++, C, assembly, firmware, microcode, and/or other languages and tools. Software, whether an entire system or a component of a system, may be embodied as an article of manufacture and maintained or provided as part of a computer-readable medium as defined previously. Another form of the software may include signals that transmit program code of the software to a recipient over a network or other communication medium. Thus, in one example, a computer-readable medium has a form of signals that represent the software/firmware as it is downloaded from a server to a client. In another example, the computer-readable medium has a form of the software/firmware as it is maintained on a server. Other forms may also be used.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

FIG. 1 provides a one-dimensional example that describes BPE acquisition. In FIG. 1, two bunched samples represented by the pairs of black dots and white dots 105 are acquired at half the Nyquist rate. Sampling theory holds that for a limited bandwidth signal with a maximum frequency $f_{max}$, the equally spaced sampling frequency $f_s$ must be more than two times $f_{max}$. This is known as the Nyquist sampling rate threshold. The Nyquist frequency equals $f_{max}$. While the bunched samples include two points, it is to be appreciated that in other examples two or more bunched samples may be acquired. The black dots and white dots 105 in image 100 represent sample locations in Fourier space. L is a field of view (FOV) for an image reconstructed from data acquired at the Nyquist rate. M is an amplitude of an image reconstructed from the data acquired at the Nyquist rate. α is the distance between the two bunched samples. $I_0$ and $I_\alpha$ are the images reconstructed from the data sampled at the black dots and white dots 105 via inverse Fourier Transform, respectively. Using these notations, for an interval of interest (e.g., [0, L/2]), $I_0$ and $I_\alpha$ may be expressed as:

$$\begin{pmatrix} I_0 \\ I_\alpha \end{pmatrix} = \frac{1}{2}\begin{pmatrix} 1 & 1 \\ 1 & e^{i\alpha\pi} \end{pmatrix}\begin{pmatrix} M(x) \\ M\left(x-\frac{L}{2}\right) \end{pmatrix} \quad \text{Equation [2]}$$

$I_0$ and $I_\alpha$ are similar images but they have different phases because they are associated with data retrieved from different phase encoding lines. The data was retrieved from different phase encoding lines because the oscillatory phase encoding gradient was used during readout. Subtracting $I_\alpha$ from $I_0$ will cause in-phase data to be cancelled, but will leave the out-of-phase data from which an aliasing artifact free image may be produced. Both $I_0$ and $I_\alpha$ alone would have aliasing artifacts. However, using a reconstruction technique described herein, a substantially artifact free image can be produced. In $I_0$ a second image loop is described by ½M(x−L/2). Similarly, in $I_\alpha$ a second loop is described by ½M(x−L/2) $e^{j\alpha\pi}$. α is known as it is the distance between the points. From Equation 2, M(x) and M(x−L/2) can be calculated via matrix inversion.

Figure 2:
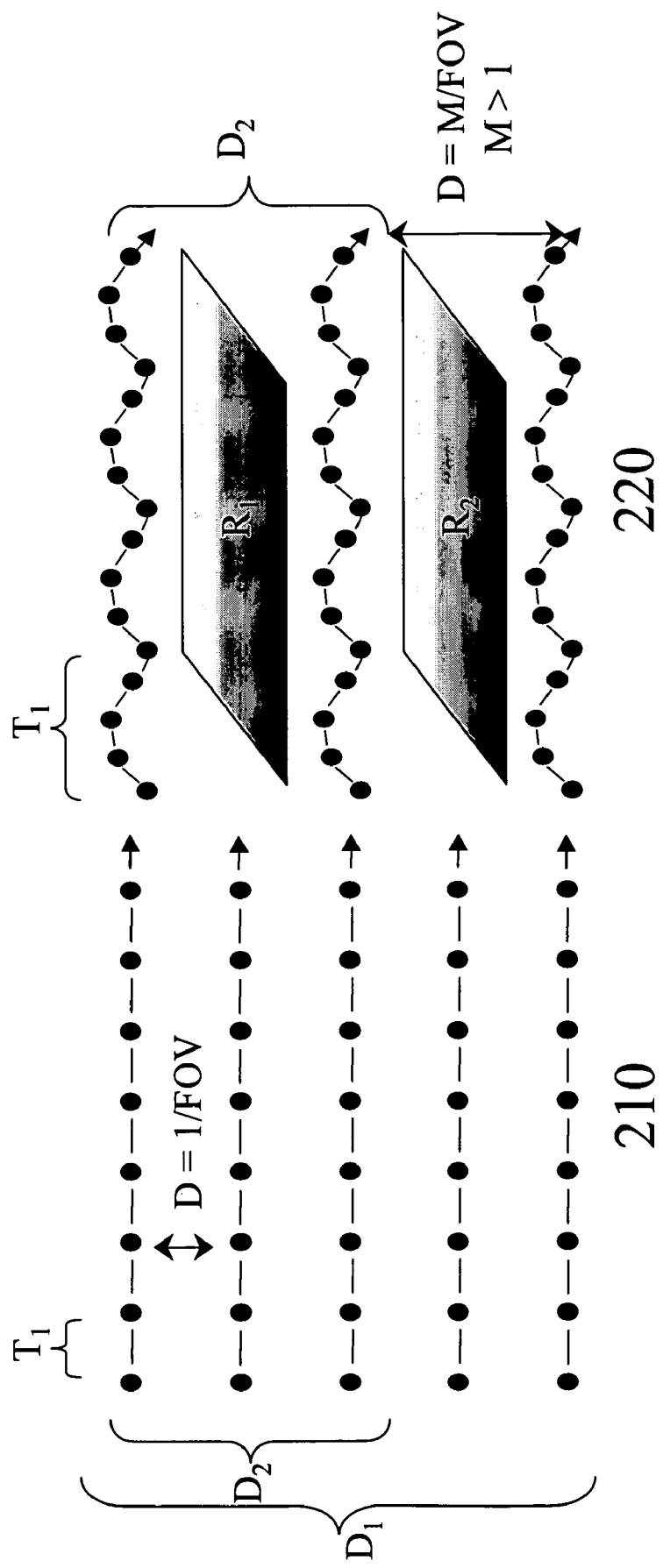
FIG. 2 illustrates concepts associated with BPE acquisition and conventional rectilinear acquisition.
Figure 3:
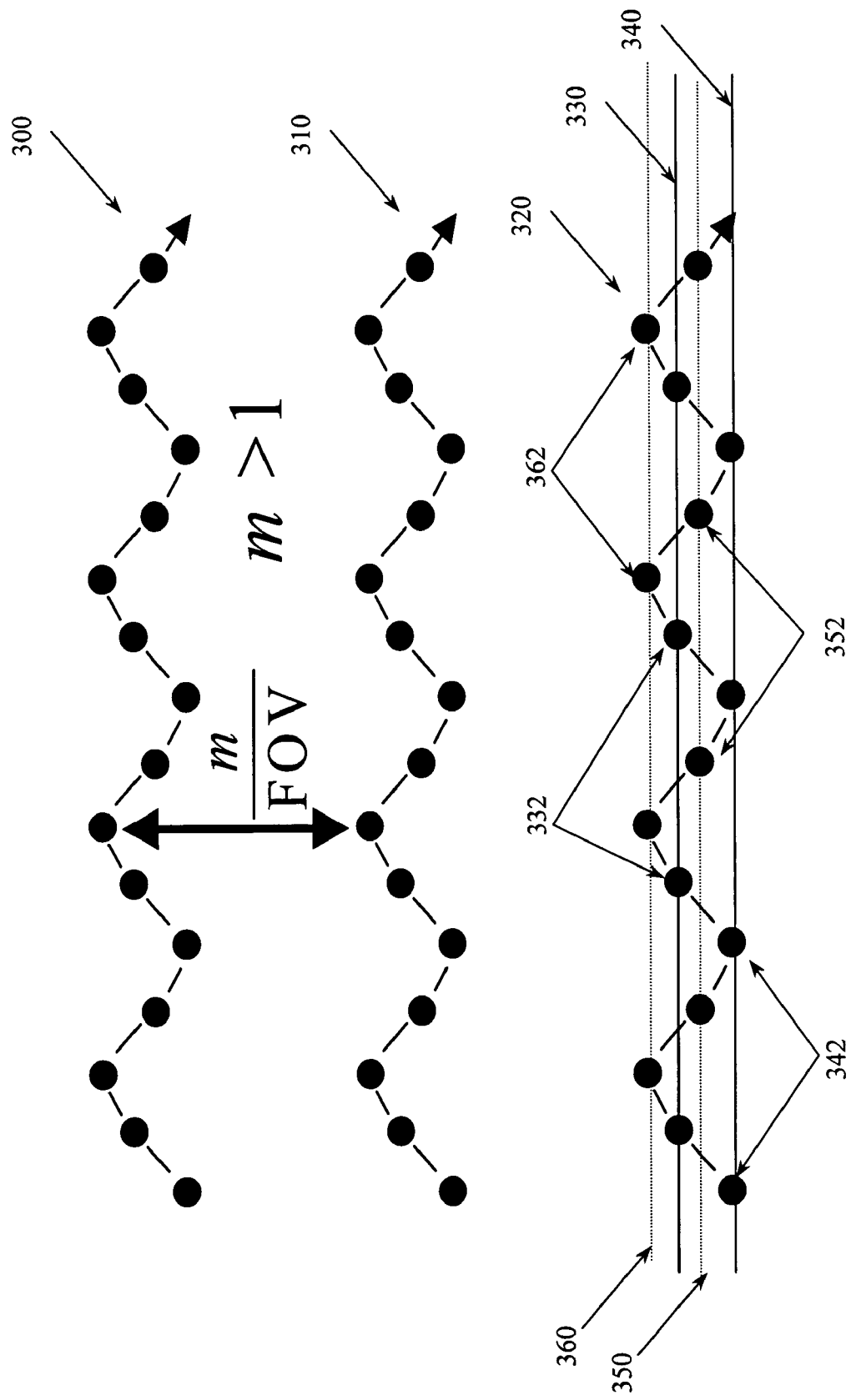
FIG. 3 illustrates concepts associated with example BPE k-space trajectories.

FIG. 2 illustrates k-space trajectories 210 in normal rectilinear acquisition and an example k-space trajectory 220 for BPE. In trajectories 220, k-space data are sampled along zigzag lines at a rate higher than a normal sampling rate usually employed in trajectories 210. For example, in trajectories 220 data from more than one phase encoding line may be acquired during a single readout. In one example, the spacing between two neighboring BPE trajectories in the phase encoding direction may be greater than that employed in a normal rectilinear sampling method. For example, in a normal rectilinear sampling method, the spacing between lines in trajectories 210 may be 1/FOV. However, in BPE, the spacing between lines in trajectories 220 may be M/FOV, where M>1. Thus k-space data may be acquired in a shorter scan time by reducing the total number of TR cycles.

In FIG. 2, trajectories 210 illustrate five linear trajectories employed in normal rectilinear acquisition. The space covered by the five linear trajectories 210 is $D_1$. The time to acquire the data from space $D_1$ using trajectories 210 is five times TR. Also in FIG. 2, trajectories 220 illustrate three non-linear trajectories employed in BPE. The space covered by the three non-linear trajectories 220 is also $D_1$. However, the time to acquire the data from space $D_1$ using trajectories 220 is three times TR. However, when using trajectories 220, data from regions $R_1$ and $R_2$ may not be acquired. The regions $R_1$ and $R_2$ are not covered and therefore the Nyquist sampling threshold is not satisfied. Additionally, the data from these regions cannot be estimated. Thus, reconstruction techniques described herein may be employed to facilitate producing aliasing artifact free images even though the Nyquist sampling threshold is not satisfied. The oscillating trajectories 220 may be referred to as having a zigzag pattern. Other trajectories may have other shapes like a sinusoidal shape. The terminology (e.g., zigzag, sinusoidal) is merely descriptive and is not intended to limit the patterns available to be employed as oscillatory phase encoding gradients applied during a readout.

In FIG. 2, trajectories 210 may acquire data associated with a first number of points in k-space during a time period T1. However, trajectories 220 may acquire data associated with a second greater number of points in k-space during the same time period T1. Additionally, while data acquired using a single trajectory 210 may all be associated with a single phase encoding line, data acquired using a single trajectory 220 may be associated with multiple phase encoding lines.

FIG. 3 illustrates concepts associated with example BPE acquisition k-space trajectories. Three patterns 300, 310, and 320 represent example zigzag trajectories. The distance between these three patterns is illustrated as m/FOV, where m>1. Thus, using these patterns spaced m/FOV apart scan time can be reduced as compared to conventional rectilinear acquisition.

Pattern 320 illustrates two points 342 that are associated with a first phase encoding line 340. Similarly, pattern 320 illustrates two points 332 that are associated with a second phase encoding line 330. Using patterns like those illustrated in FIG. 3, data from more than one phase encoding line (e.g., 330, 340) may be acquired during each readout. As described above, this facilitates covering a data space using fewer TR cycles and thus facilitates reducing total scan time.

Oscillatory pattern (e.g., zigzag) design may depend on different conditions. An oscillatory pattern may have different design parameters (e.g., amplitude, spacing, frequency, pattern). For example, a pattern may be designed to facilitate acquiring more data in a given period than is acquired using a conventional rectilinear pattern. By way of illustration, while pattern 320 is illustrated acquiring data from two phase encoding lines 330 and 340, additional data from additional phase encoding lines may be available. For example, points 352 may be associated with a phase encoding line 350 and points 362 may be associated with a phase encoding line 360. Thus, it is to be appreciated that while pattern 320 is illustrated acquiring data from two phase encoding lines, example systems and methods may facilitate acquiring data from two or more phase encoding lines. The number of phase encoding lines from which data is acquired per readout controls, at least in part, the time reduction factor for BPE over conventional rectilinear acquisition. For example, if data is acquired from two phase encoding lines per readout, then a reduction factor of around two may be achieved while if data is acquired from three phase encoding lines per readout then a reduction factor of around three may be achieved. In theory, the total number of phase encoding lines from which data may be read may be increased by using a higher frequency for the oscillating patterns. While this theoretical increase may facilitate improved image reconstructions, it may be difficult to achieve due to gradient design issues surrounding increased slew rates.

FIG. 4 illustrates concepts associated with example BPE acquisition and conventional rectilinear acquisition. Acquisition pattern 410, which is associated with a rectilinear acquisition, illustrates acquiring data associated with k-space data points at substantially constant time intervals. For example, in a time period $2\Delta k$, where $\Delta k$ equals 1/FOV, two data points are acquired. However, pattern 420, which is associated with a first BPE acquisition, illustrates a bunched approach to acquiring data associated with k-space data points. While pattern 420 still acquires data associated with two data points in a time period $2\Delta k$, the data is not acquired at substantially constant time intervals. Similarly, pattern 430, which is associated with a second BPE acquisition, illustrates a bunched approach to acquiring data associated with k-space data points. While pattern 430 acquires data associated with three data points in the same time interval that pattern 410 would acquire the same amount of data, note that the data is acquired at different points in time.

Figure 5:
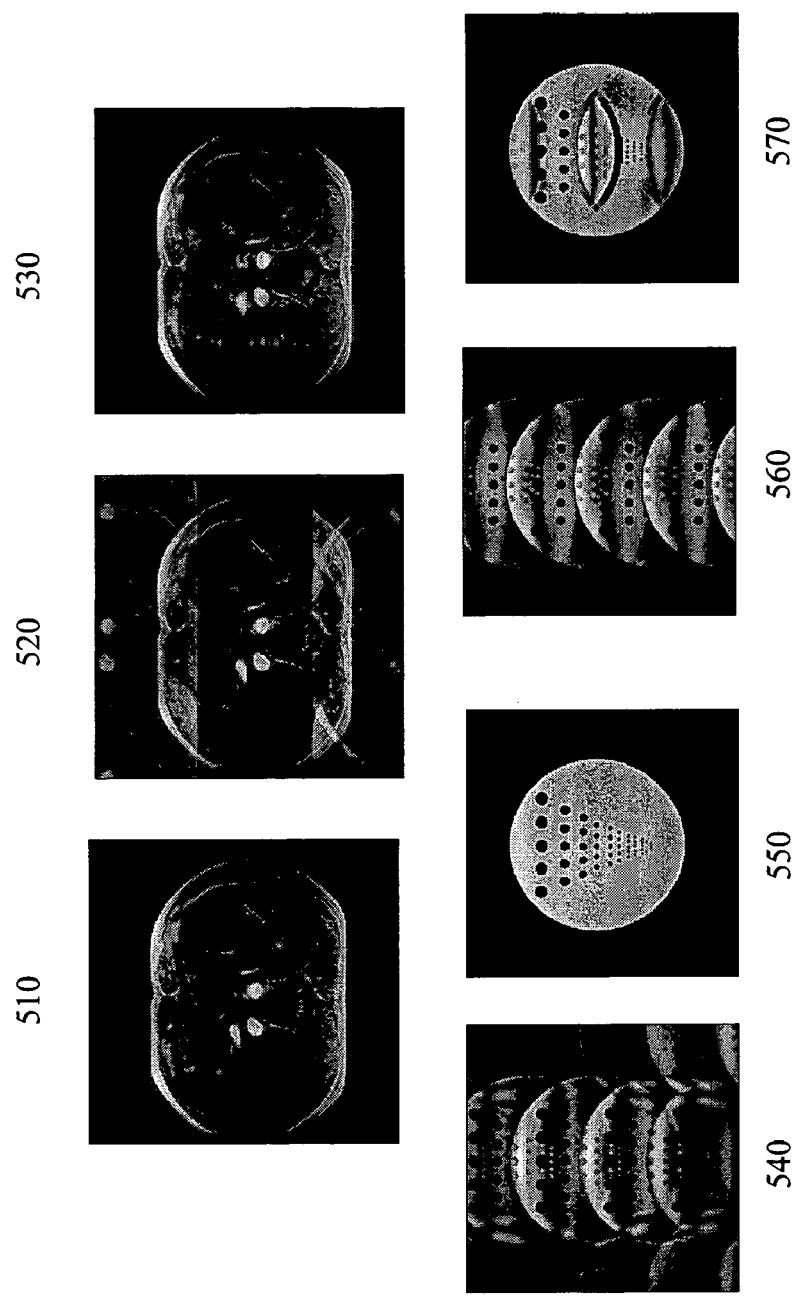
FIG. 5 illustrates MRI images produced using different acquisition and reconstruction techniques.

FIG. 5 illustrates MRI images produced using different acquisition and reconstruction techniques. Images 510 through 530 compare results between conventional rectilinear acquisition/reconstruction and BPE acquisition/reconstruction. The images come from in-vivo experiments performed using a 1.5 Tesla Siemens Sonata Scanner. A human abdomen was scanned using a standard FISP sequence including 128 TR cycles with 1024 samples acquired for each TR. Image 510 is a 256×256 image reconstructed from the acquired k-space data using matrix inversion. Image 520 is a 256×256 image reconstructed from the same data but using conventional gridding for comparison. A standard FISP sequence that consists of 256 TR cycles with 256 samples/TR was also implemented for comparison. The scan time of the standard sequence was twice that of the BPE sequence. Image 530 is a 256×256 image reconstructed from the data of the standard sequence via normal 2D Inverse Fourier Transform. In the reconstructed images illustrated in FIG. 5, the following parameters were used: TE/TR/FA=10.0/20.0 ms/30°.

Thus, image 510 represents an image reconstructed using a BPE technique with matrix inversion, image 520 represents an image reconstructed using a BPE technique with conventional gridding, and image 530 represents an image reconstructed using a standard acquisition and 2D-IFT. Note that no apparent aliasing artifacts are observed in 510 while 520 is affected by significant aliasing artifacts. The ratio of the theoretical SNR of 510 to that of 530 would be 44.2% if the noise is uncorrelated from one sample to the next during data acquisition. The ratio of measured SNR of 510 to that of 530 was 45.6%. As observed in 520, images reconstructed using a normal gridding reconstruction method may be affected by aliasing artifacts when the k-space data are acquired using BPE sampling since the Nyquist sampling threshold is not satisfied. Therefore, reconstruction techniques like the matrix inversion method described herein are required to produce an image like 510 which is substantially free of aliasing artifacts related to the Nyquist sampling threshold not being satisfied.

Figure 6:
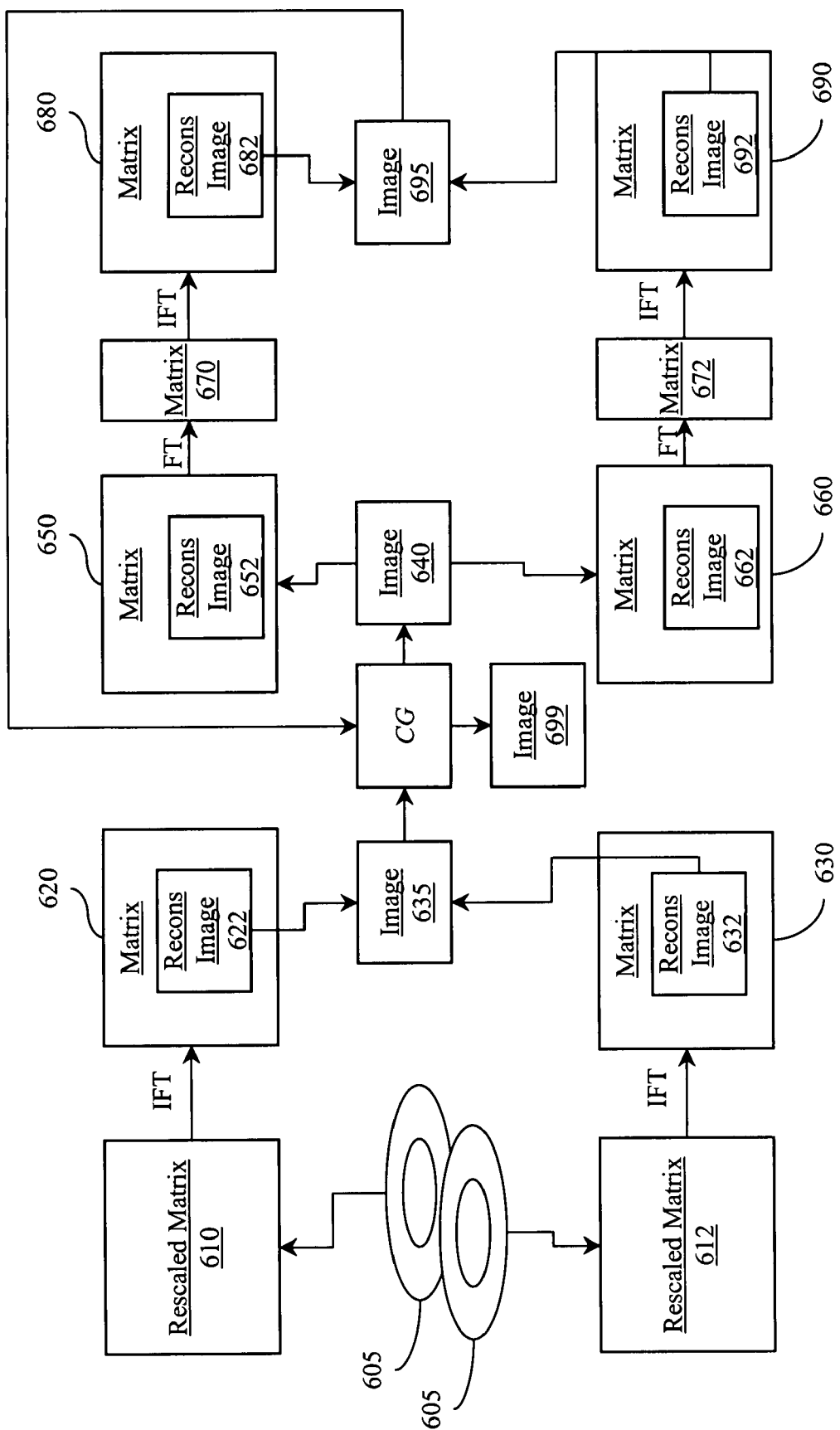
FIG. 6 illustrates a processing flow associated with performing BPE coupled with parallel data acquisition.
Figure 7:
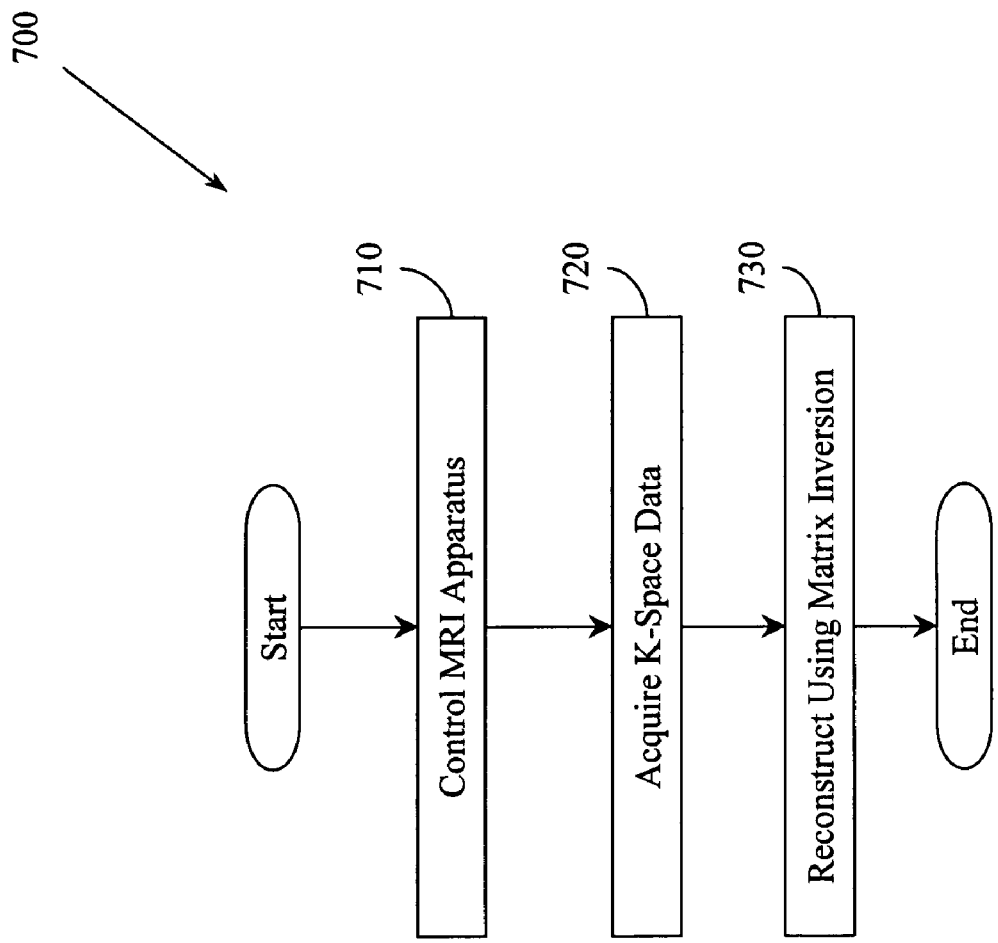
FIG. 7 illustrates an example method associated with BPE processing.
Figure 8:
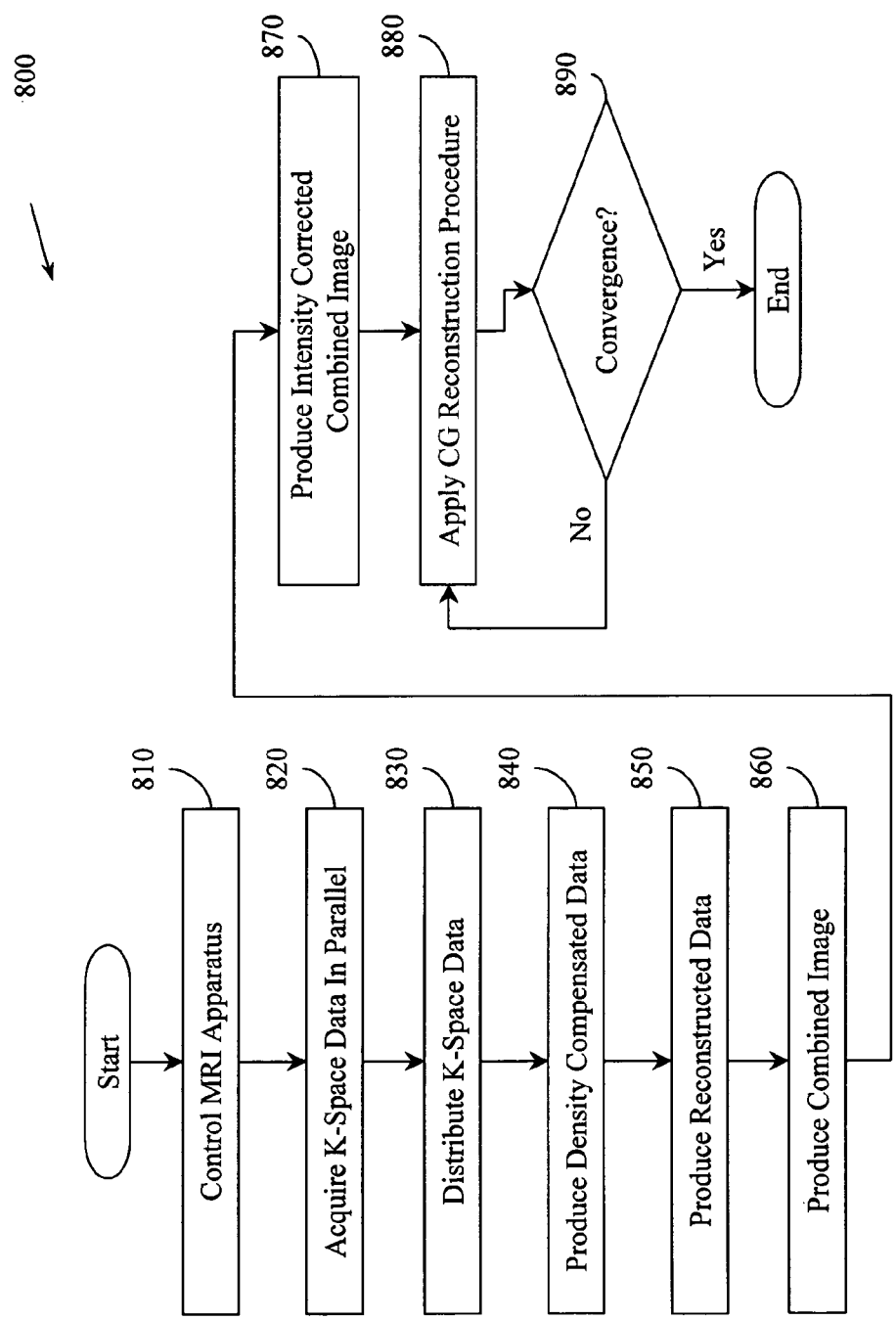
FIG. 8 illustrates an example method associated with BPE processing coupled with parallel data acquisition.

FIG. 6 illustrates a processing flow associated with performing BPE coupled with parallel data acquisition. In one example, the parallel data acquisition may be a sensitivity encoding (SENSE) technique. FIG. 7 illustrates an example method associated with BPE processing. FIG. 8 illustrates an example method associated with BPE processing coupled with SENSE. In the flow diagrams of FIGS. 6 through 8, blocks denote "processing blocks" that may be implemented with logic. The processing blocks may represent a method step and/or an apparatus element for performing the method step. A flow diagram does not depict syntax for any particular programming language, methodology, or style (e.g., procedural, object-oriented). Rather, a flow diagram illustrates functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown and/or that blocks may be combined or separated into multiple components.

FIG. 6 illustrates a processing flow associated with performing BPE with parallel signal acquisition like SENSE. As described above, in BPE more than one phase encoding line may be acquired during a single readout by applying an oscillatory phase encoding gradient during the readout. This allows the total number of TR cycles to be reduced, which in turn facilitates reducing total scan time. Parallel imaging methods may use multiple receiver channels. Thus, parallel imaging methods like sensitivity encoding (SENSE) also facilitate reducing MR data acquisition times by acquiring data in parallel. A combination of BPE with SENSE can lead to further accelerating data acquisition in MRI.

Unfortunately image reconstruction for BPE with SENSE, if performed via the matrix inversion technique described for BPE alone (e.g., method 700, FIG. 7) may be undesirably computationally intense. However, a modified form of the conjugate gradient (CG) method that has been employed as a reconstruction method for SENSE acquisitions with non-uniform data acquisition may provide relief. The CG method avoids inversion of large matrices and uses an iterative algorithm to gain computational efficiency. In one example, for the combination of BPE with SENSE, the CG method may be altered to facilitate computationally acceptable image reconstruction. In the altered CG method, convolution based gridding is not employed. Rather, k-space data is distributed to rescaled matrices in a manner similar to iterative next neighbor re-gridding (INNG). The adapted method (e.g., portions of method 800, FIG. 8) may be referred to as CG-INNG.

In FIG. 6, smaller squares (e.g., 622, 632) represent N×N matrices, and larger squares represent sN×sN matrices, where N is one side of a target image matrix and s is a scaling factor. Coils 605 employed in parallel acquisition provide k-space data that is distributed to rescaled matrices 610 and 612 whose values are initially set to zero. The distributed data are then density-compensated in the matrices 610 and 612. Inverse Fourier Transforms (IFT) are performed on matrices 610 and 612 to produce matrices 620 and 630. Reconstructed images 622 and 632 at the center of 620 and 630 are extracted. The images 622 and 632 are combined and then intensity-corrected, yielding matrix 635. Image 635 is processed using the CG algorithm to produce image 640.

Sensitivity maps, multiplied by image 640 are set to the center of a large matrix of zeros, as shown in matrices 650 and 660. Fourier Transforms (FTs) are then performed on the matrices 650 and 660 leading to updated k-space data in larger rescaled matrices 670 and 672. In matrices 670 and 672, k-space data corresponding to locations where original data existed is retained and then locally density-compensated. K-space data corresponding to locations where no original data existed is set to zeroes. IFTs are performed on matrices 670 and 672, yielding matrices 680 and 690. Reconstructed images 682 and 692 at the center of matrices 680 and 690 are combined and intensity-corrected, yielding image 695. The CG algorithm may then be repeated on 695 until the image converges at which time image 699 is provided.

Returning now to FIG. 5, images 540 through 570 illustrate results observed during BPE with SENSE experiments. The MR experiments were performed using a 1.5 Tesla Siemens Sonata Scanner. A resolution phantom was scanned with a zigzag FISP sequence and a standard FISP sequence using two receiver channels. Parameters TE/TR/FA=10.0/20.0 ms/30° were employed in both sequences. The zigzag FISP was designed with 128 oscillations during each readout. Each sequence included 64 TR cycles with 1024 samples acquired per TR. In total, a reduction of a factor of about four over a normal 256×256 acquisition was achieved. A 256×256 image was reconstructed from the data acquired with each sequence via the CG-INNG method described in association with FIG. 6. In the CG-INNG reconstruction, the scaling factor was set to sixteen and thirty iterations were performed. For each sequence, an image was also reconstructed using conventional gridding for comparison.

Image 540 is an image reconstructed using a zigzag FISP with conventional gridding. Image 550 is an image reconstructed using a zigzag FISP with CG-INNG. Fifteen iterations of CG-INNG were performed to produce image 550. Image 560 represents an image reconstructed using a standard FISP with conventional gridding. Image 570 represents an image reconstructed using a standard FISP with CG-INNG. Fifteen iterations of CG-INNG were performed to produce image 570. In the CG-INNG reconstructions, no significant change was observed in the images after fifteen iterations. As seen in 540 and 560, images reconstructed using conventional gridding were affected by substantial aliasing artifacts in both zigzag and standard FISP sequences. However, no apparent aliasing artifacts were observed in 550 while aliasing artifacts remain in 570.

Thus, from images 510 through 530 and images 540 through 570 it has been demonstrated that images can be constructed with no apparent aliasing artifacts related to not satisfying the Nyquist sampling threshold when using a BPE technique. The images can be constructed using data acquired from a BPE process where data from multiple phase encoding lines is acquired during a single readout. The patterned lines in BPE acquisition sample data from more than one phase encoding line to better fill k-space from each single readout. The oscillating pattern in BPE therefore facilitates reducing scan time. However, as described above, BPE can be combined with parallel acquisition techniques like SENSE. Since the acceleration of BPE is independent of the acceleration possible through parallel acquisition techniques, the combination of these imaging methods can lead to even further reductions in scan time at the expense of additional computational overhead. In SENSE, the regular Pruessmann's processing method may require both forward and backward gridding. This in turn requires calculating coefficients for both the forward and backward gridding. However, using the rescaling matrix approach as described above in connection with FIG. 6 facilitates removing the computational overhead associated with gridding. Gridding is abandoned because the k-space data is spread out into the rescaling matrices.

FIG. 7 illustrates an example method 700 associated with BPE processing. Method 700 may facilitate acquiring a k-space data associated with an object from which a magnetic resonance imaging (MRI) signal is acquired by an NRI apparatus during an MRI readout phase. The object may be, for example, a human, an animal (e.g., horse, dog, cat), and the like. The MRI apparatus may be, for example, a 1.5 Tesla Siemens Sonata Scanner.

Method 700 may include, at 710, controlling the MRI apparatus to produce an oscillating phase encoding gradient during the MRI readout phase. The oscillating phase encoding gradient may be selectively applied to a main magnetic field (e.g., $B_0$) produced by the MRI apparatus. The gradient may be designed with different patterns. For example, the gradient may have a zigzag pattern, a sinusoidal pattern, a complex pattern formed from a set of sine waves, and the like. While three example patterns are described, it is to be appreciated that other patterns may be employed. Furthermore, in some examples the pattern may be user selectable and/or user configurable. Since method 700 may be performed by an MRI apparatus, producing the oscillating phase encoding gradient during the MRI readout phase may include controlling a radio frequency (RF) antenna associated with the MRI apparatus to produce a phase encoding gradient with an oscillating amplitude.

The gradient may be configured to oscillate with different frequencies. In one example, the gradient may oscillate with a frequency of at least 12.8 Kilohertz while in another example the gradient may oscillate with a frequency of about 15 Kilohertz. While two frequencies are described, it is to be appreciated that higher and/or lower frequencies may be employed. In some examples, the frequency may be user selectable and/or user configurable.

In different examples, the gradient may have different amplitudes. In one example, a gradient may produce a zigzag k-space trajectory that has a maximum amplitude of less than M/(2*FOV), where M is a real number less than 1.0 and FOV is a field of view of an image to be reconstructed from the k-space data. In another example, the maximum amplitude may be less than M/(3*FOV). While two amplitudes are described, it is to be appreciated that other maximum amplitudes may be employed. Furthermore, in some examples the maximum amplitude may be user selectable and/or configurable.

Method 700 may also include, at 720, acquiring the k-space data from multiple (e.g., two, three) phase encoding lines during the MRI readout phase. The acquiring will be controlled, at least in part, by properties of the oscillating phase encoding gradient. For example, the design (e.g., zigzag, sinusoidal), the amplitude, the frequency, the spacing between k-space trajectories, and so on may determine, at least in part, the number of phase encoding lines from which data will be acquired. By way of illustration, neighboring oscillating phase encoding gradients may be spaced more than M/FOV apart, M being a real number greater than 1.0. Thus, in different examples, the spacing may be user selectable and/or configurable.

In one example, the k-space data may be acquired in bunched samples. For example, bunched samples with X members, X being an integer greater than 1 may be acquired. In the bunched samples, members may be spaced a distance $\alpha$ apart, $\alpha$ being greater than zero. The spacing $\alpha$ may take on different sizes greater than zero. It is to be appreciated that $\alpha$ may not be constrained by the number of bunched samples or the FOV. In some examples, a may be user selectable and/or configurable. Additionally, the k-space data may be acquired at a rate of 1/X of the Nyquist rate in the Fourier domain. Since X>1, the Nyquist sampling threshold may not be satisfied. Conventional systems would therefore produce reconstructed images that suffer from aliasing artifacts related to the Nyquist sampling threshold not being satisfied. Example images suffering from this defect are discussed in connection with FIG. 5.

Method 700 may also include, at 730, reconstructing an image from the k-space data. Unlike conventional systems, the effect of aliasing artifacts related to the Nyquist data sampling threshold not being satisfied may be mitigated. In one example, the image may be completely free from aliasing artifacts while in another example the image may be substantially (e.g., less than completely) free from aliasing artifacts.

Reconstructing the image at 730 may include performing a one dimensional inverse Fourier transform (IFT) on the k-space data to produce a first reconstructed data. Reconstructing the image at 730 may also include decomposing the first reconstructed data using a matrix inversion that is based, at least in part, on a positional shift associated with the k-space data.

FIG. 8 illustrates an example method 800 associated with BPE processing. Method 800 may include, at 810, controlling an MRI apparatus in a manner like that associated with action 710 in method 700. Thus, the gradient may have various properties (e.g., pattern, amplitude, spacing) that may, in some examples, be user selectable and/or configurable.

Method 800 may also include, at 820, acquiring the k-space data in parallel from multiple radio frequency (RF) receivers associated with the MRI apparatus. While different parallel acquisition techniques may be employed, in one example, the k-space data may be acquired in parallel according to a sensitivity encoding (SENSE) methodology.

Method 800 may also include reconstructing an image from the k-space data. Unlike conventional parallel systems, the reconstructed image will be free of or substantially free of aliasing artifacts related to the Nyquist data sampling threshold not being satisfied. Examples of such artifact free and artifact affected reconstructed images are provided in FIG. 5. Reconstructing the image to be substantially free from aliasing artifacts may involve several actions.

Thus, method 800 may include, at 830, distributing the k-space data to rescaled matrices. While two rescaled matrices are illustrated in FIG. 6, it is to be appreciated that a greater number of matrices may be employed in some systems. Distributing the k-space data to these rescaled matrices removes the conventional need to do traditional gridding. Thus, conventional gridding coefficients need not be computed. Therefore, the reconstruction method for BPE with SENSE differs from conventional systems in at least this aspect, the distribution of data to rescaled matrices and the absence of gridding.

Method 800 may also include, at 840, producing density compensated data sets. These data sets may be produced, for example, by density compensating data in the rescaled matrices. At 850, first reconstructed data sets may then be produced from the density compensated data sets by performing an inverse Fourier transform (IFT) on the density compensated data sets.

Method 800 may also include, at 860, producing a first combined image from the reconstructed data sets. Multiple (e.g., two or more) first reconstructed images may be extracted from central regions in the first reconstructed data sets. These reconstructed images may then be combined. At 870, the combined image may be intensity corrected to produce an intensity corrected combined image. Once this intensity corrected combined image has been created, a conjugate gradient (CG) reconstruction procedure may be repeatedly applied to the intensity corrected combined image at 880.

One example CG procedure may include producing a CG image by performing a CG reconstruction method on the intensity corrected combined image. The example CG procedure may also include producing updated CG images by multiplying sensitivity maps by the CG image. The example CG procedure may also include producing an updated k-space data in rescaled matrices by Fourier transforming the updated CG images. Not all the data in the rescaled matrices will be retained. For example, some data will be selectively retained in the rescaled matrices if a data point existed at a corresponding location in the original k-space data. Similarly, some data will be selectively cleared if no data point existed at a corresponding location in the original k-space data.

The example CG procedure may also include producing first reconstructed images by inverse Fourier transforming the rescaled matrices and then extracting second reconstructed images from central regions in the first reconstructed images. These extracted second reconstructed images may then be combined to produce a combined second reconstructed image. The example CG procedure may also include producing a second intensity corrected image by intensity correcting the combined second reconstructed image. In one example, if the second intensity corrected image has achieved a desired convergence threshold then the procedure may conclude. But if the second intensity corrected image has not achieved the desired convergence threshold, then method 800 may include selectively providing the second intensity corrected image to the CG reconstruction method as an input as the first intensity corrected combined image. While a convergence threshold is described, in other examples, a finite number of iterations may be performed. For example, method 800 may be configured to perform a user selectable and/or configurable number of iterations like fifteen iterations, fifty iterations, as many iterations as can be performed in a period of time (e.g., one minute) and so on.

In one example, methodologies are implemented as processor executable instructions and/or operations provided on a computer-readable medium. Thus, in one example, a computer-readable medium may store processor executable instructions operable to perform a method for acquiring a k-space data associated with an object from which a magnetic resonance imaging (MRI) signal is acquired by an MRI apparatus during an MRI readout phase. The method may include controlling the MRI apparatus to produce an oscillating phase encoding gradient during the MRI readout phase. The oscillating phase encoding gradient may be selectively applied to a main magnetic field ($B_0$) produced by the MRI apparatus. The method may also include acquiring the k-space data from more than one phase encoding line during the MRI readout phase. How the acquiring occurs will depend, at least in part, on properties (e.g., pattern, amplitude) of the oscillating phase encoding gradient. While the method is described being provided on a computer-readable medium, it is to be appreciated that other example methods described herein can also be provided on a computer-readable medium.

Figure 9:
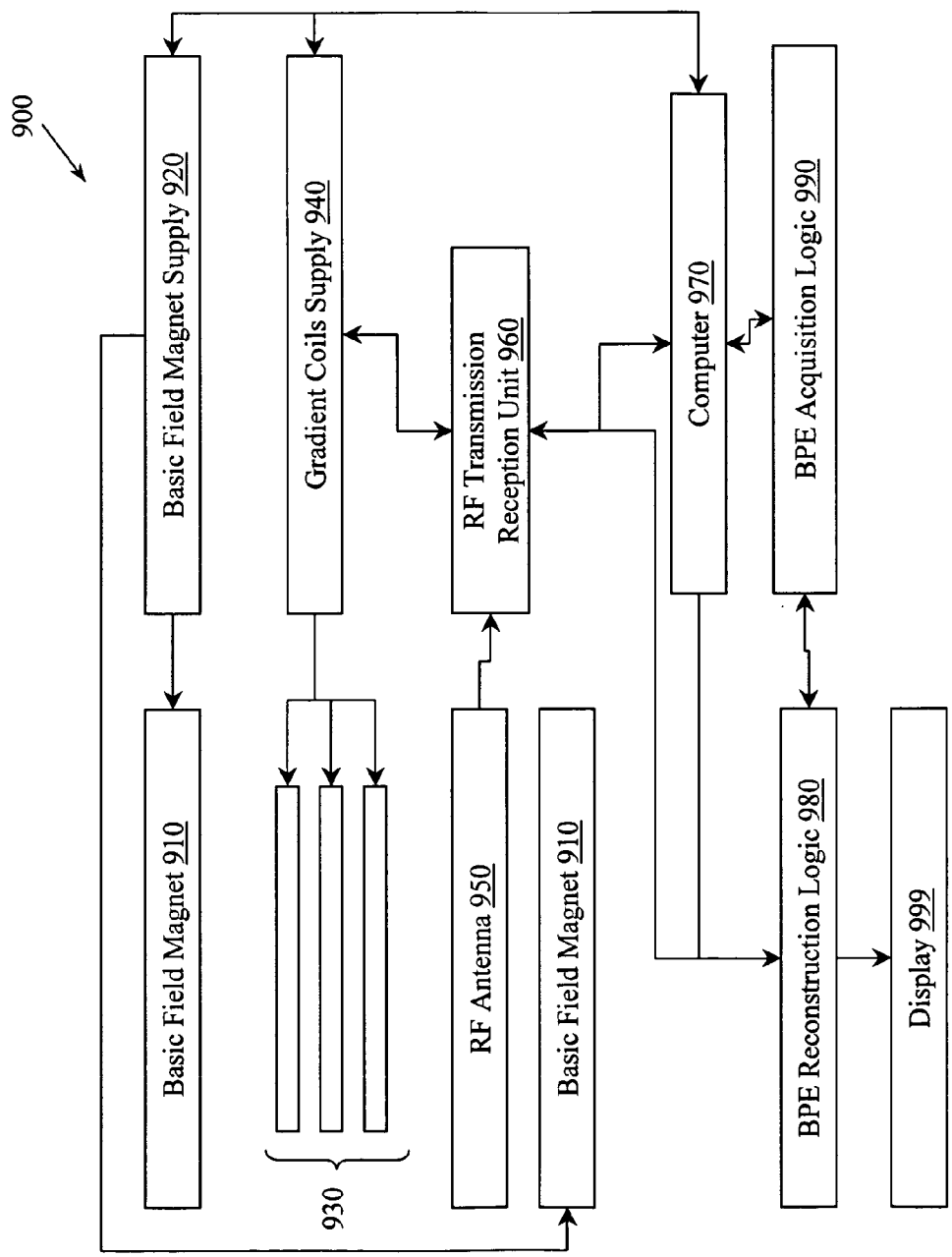
FIG. 9 illustrates an example MRI apparatus.

FIG. 9 illustrates an example MRI apparatus 900. The apparatus 900 includes a basic field magnet(s) 910 and a basic field magnet supply 920. Ideally, the basic field magnet(s) 910 would produce a uniform $B_0$ field. However, in practice, the $B_0$ field may not be uniform and may vary over an object being imaged by the MRI apparatus 900.

MRI apparatus 900 may include a bunched phase encoding (BPE) acquisition logic 990 that is configured to facilitate performing portions of example methods described herein. For example, logic 990 may be configured to perform portions of method 700 and/or method 800. Thus, MRI apparatus 900 is an example of an apparatus that may perform methods 700 and/or 800. The BPE acquisition logic 990 may be configured to facilitate controlling a gradient coil(s) to produce an oscillating phase encoding gradient that may be applied to the $B_0$ field during a readout phase. For example, BPE acquisition logic 990 may control the oscillating phase encoding gradient to facilitate acquiring k-space data from multiple (e.g., two or more) phase encoding lines during a single readout phase.

MRI apparatus 900 may include gradient coils 930 that are configured to emit gradient magnetic fields like $G_S$, $G_P$ and $G_R$. The gradient coils 930 may be controlled, at least in part, by a gradient coils supply 940 and/or BPE acquisition logic 990. The MRI apparatus 900 may also include an RF antenna(s) 950 that is/are configured to generate RF pulses and to receive resulting magnetic resonance signals from an object in the $B_0$ field to which the RF pulses are directed. Alternatively, separate RF transmission and reception coils can be employed. The RF antenna 950 may be controlled, at least in part, by an RF transmission/reception unit 960. The gradient coils supply 940 and the RF transmission/reception unit 960 may be controlled, at least in part, by a control computer 970. In one example, the control computer 970 may be programmed to perform methods like those described herein.

In one example, BPE acquisition logic 990 may control a gradient coil(s) 930 so that k-space trajectories produced by successive oscillating phase encoding gradients are separated by M/FOV, M being a real number greater than 1.0, FOV being a field of view of an image to be reconstructed from the k-space data. In another example, BPE acquisition logic 990 may control a gradient coil(s) 930 so that the oscillating phase encoding gradient facilitates acquiring the k-space data in X bunched samples, X being an integer greater than 1. BPE acquisition logic 990 may also control a gradient coil(s) 930 and/or the RF antenna(s) 950 to acquire the k-space data at least at a rate of 1/X of the Nyquist rate in the phase encoding direction of the Fourier domain, where members of the X bunched samples are spaced a distance α apart, α being greater than 0.

The magnetic resonance signals received from the RF antenna 950 can be employed to generate an image. The transformation can be performed by a BPE reconstruction logic 980. In one example, reconstruction logic 980 may be programmed to perform portions of methods like those described herein (e.g., method 700, method 800) and/or to receive data from logic 990 which may be configured to perform portions of methods like those described herein. The image data may then be shown on a display 999.

Thus, BPE reconstruction logic 980 may be configured to facilitate reconstructing an image from the k-space data so that the effect of aliasing artifacts related to the Nyquist data sampling threshold not being satisfied are mitigated. BPE reconstruction logic 980 may be configured to perform an inverse Fourier transform (IFT) on the k-space data to produce a first reconstructed data and then to decompose the first reconstructed data using a matrix inversion. The matrix may be based, at least in part, on a positional shift associated with the k-space data.

In one example, BPE acquisition logic 990 may be configured to facilitate acquiring the k-space data in parallel according to a sensitivity encoding (SENSE) methodology. Thus, BPE reconstruction logic 980 may be configured to facilitate reconstructing an image from the k-space data, where the image will not suffer from aliasing artifacts due to not satisfying the Nyquist sampling threshold. Reconstructing the image may include distributing the k-space data to rescaled matrices. Since the k-space data will be distributed to the rescaling matrices, reconstructing the image does not include computing a gridding co-efficient and does not include gridding.

While FIG. 9 illustrates an example MRI apparatus 900 that includes various components connected in various ways, it is to be appreciated that other MRI apparatus may include other components connected in other ways. However, to implement the example systems and methods described herein, an MRI apparatus will be configured with a BPE acquisition logic 990 and/or a BPE reconstruction logic 980 and/or have a component programmed with computer executable instructions operable to perform methods described herein. In one example, an existing MRI apparatus may be upgraded or reconfigured with a BPE acquisition logic 990 and/or a BPE reconstruction logic 980. In different examples, the BPE logics 990 and/or 980 may be permanently and/or removably attached to an MRI apparatus.

Figure 10:
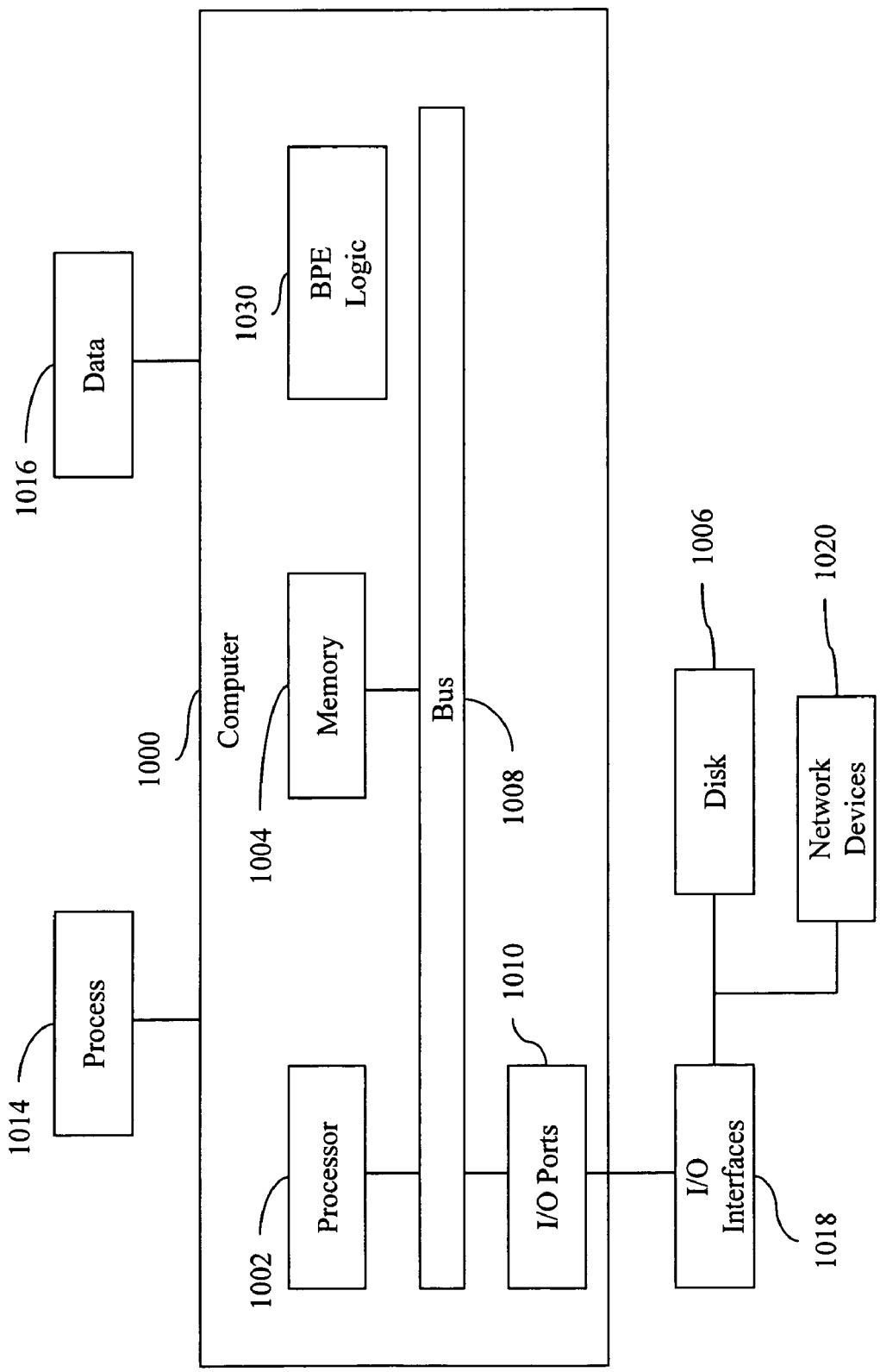
FIG. 10 illustrates an example computing environment configured to perform BPE processing.

FIG. 10 illustrates an example computing environment configured to participate in BPE processing. FIG. 10 illustrates a computer 1000 that includes a processor 1002, a memory 1004, and input/output ports 1010 operably connected by a bus 1008. In one example, computer 1000 may include a BPE logic 1030 that is configured to perform example methods described herein like methods 700 and 800. Thus, the BPE logic 1030, whether implemented in computer 1000 as hardware, firmware, software, and/or a combination thereof may provide means (e.g., hardware, software) for producing an oscillating phase encoding gradient during a readout phase, the oscillating phase encoding gradient being configured to facilitate acquiring data from multiple phase encoding lines during a single readout phase. BPE logic 1030 may also provide means (e.g., hardware, software) for reconstructing an image from the data acquired from two or more phase encoding lines. BPE logic 1030 may be permanently and/or removably attached to the computer 1000. In different examples, computer 1000 may be operably connected to and/or integrated with an MRI apparatus.

Processor 1002 can be a variety of various processors including dual microprocessor and other multi-processor architectures. Memory 1004 can include volatile memory and/or non-volatile memory. The non-volatile memory can include ROM, PROM, EPROM, EEPROM, and the like.

Volatile memory can include, RAM, synchronous RAM (SRAM), dynamic RAM (DRAM), and the like.

A disk 1006 may be operably connected to the computer 1000 via, for example, an input/output interface (e.g., card, device) 1018 and an input/output port 1010. The disk 1006 may be, for example, devices like a magnetic disk drive, a solid state disk drive, a floppy disk drive, a tape drive, and the like. Furthermore, the disk 1006 can include optical drives like a CD-ROM, a CD recordable drive (CD-R drive), a CD rewriteable drive (CD-RW drive), and/or a digital video ROM drive (DVD ROM). Memory 1004 can store processes 1014 and/or data 1016, for example. Disk 1006 and/or memory 1004 can store an operating system that controls and allocates resources of computer 1000.

Bus 1008 can be a single internal bus interconnect architecture and/or other bus or mesh architectures. While a single bus is illustrated, it is to be appreciated that computer 1000 may communicate with various devices, logics, and peripherals using other busses that are not illustrated (e.g., PCIE, SATA, Infiniband, 1394, USB, Ethernet). Bus 1008 can be of a variety of types including, but not limited to, a memory bus or memory controller, a peripheral bus or external bus, a crossbar switch, and/or a local bus. The local bus can be of varieties like an industrial standard architecture (ISA) bus, a microchannel architecture (MSA) bus, an extended ISA (EISA) bus, a peripheral component interconnect (PCI) bus, a universal serial (USB) bus, and the like.

Computer 1000 may interact with input/output devices via i/o interfaces 1018 and input/output ports 1010. Input/output devices can include, but are not limited to, a keyboard, a microphone, a pointing and selection device, cameras, video cards, displays, disk 1006, network devices 1020, and the like. The input/output ports 1010 can include but are not limited to, serial ports, parallel ports, and USB ports.

Computer 1000 can operate in a network environment and thus may be connected to network devices 1020 via the i/o interfaces 1018, and/or the i/o ports 1010. Through the network devices 1020, the computer 1000 may interact with a network. Through the network, the computer 1000 may be logically connected to remote computers. The networks with which the computer 1000 may interact include, but are not limited to, a local area network (LAN), a wide area network (WAN), and other networks.

While example systems, methods, and so on, have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. The scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method for acquiring a k-space data associated with an object from which a magnetic resonance imaging (MRI) signal is acquired by an MRI apparatus during an MRI readout phase, comprising:

controlling the MRI apparatus to produce an oscillating phase encoding gradient during the MRI readout phase, where the oscillating phase encoding gradient is selectively applied to a main magnetic field (B0) produced by the MRI apparatus; and acquiring the k-space data from more than one phase encoding line during the MRI readout phase where the acquiring depends, at least in part, on one or more properties of the oscillating phase encoding gradient, and where the k-space data is acquired in parallel from two or more radio frecquency (RF) receivers associated with the MRI apparatus.

2. The method of claim 1, where the oscillating phase encoding gradient has one of, a zigzag pattern, and a sinusoidal pattern, and where a k-space trajectory produced by the oscillating phase encoding gradient has a maximum amplitude of less than M/(2*FOV), M being a real number less than 1.0, FOV being a field of view of an image to be reconstructed from the k-space data.

3. The method of claim 1, where neighboring k-space trajectories that are produced by one or more oscillating phase encoding gradients are spaced more than N/FOV apart, N being a real number greater than 1.0, FOV being a field of view of an image to be reconstructed from the k-space data.

4. The method of claim 3, the k-space data being acquired in X bunched samples, X being an integer greater than 1, and where members of the X bunched samples are spaced a distance a apart, a being greater than 0.

5. The method of claim 4, the k-space data being acquired at least at a rate of 1/X of the Nyquist rate in the Fourier domain.

6. The method of claim 1, including reconstructing an image from the k-space data, the image being substantially free of aliasing artifacts related to the Nyquist data sampling threshold not being satisfied.

7. The method of claim 6, where reconstructing the image includes:

performing a one dimensional inverse Fourier transform (IFT) on the k-space data to produce a first reconstructed data; and decomposing the first reconstructed data using a matrix inversion in which a matrix is constructed based, at least in part, on a positional shift associated with the k-space data.

8. The method of claim 1, where producing the oscillating phase encoding gradient during the MRI readout phase includes controlling a radio frequency (RF) antenna associated with the MRI apparatus to produce a phase encoding gradient with an oscillating amplitude.

9. The method of claim 1, including acquiring the k-space data in parallel according to a sensitivity encoding (SENSE) methodology.

10. The method of claim 1, including reconstructing an image from the k-space data, the image being free of aliasing artifacts related to the Nyquist data sampling threshold not being satisfied.

11. The method of claim 10, where reconstructing the image includes:
   distributing the k-space data to two or more rescaled matrices;
   producing two or more density compensated data sets by density-compensating data in the rescaled matrices;
   producing two or more first reconstructed data sets by performing inverse Fourier transforms (IFT) on the density-compensated data sets;
   producing a first combined image by extracting two or more first reconstructed images from central regions in the first reconstructed data sets and combining the two or more extracted first reconstructed images;
   producing a first intensity corrected combined image by intensity correcting the first combined image; and
   repeatedly applying a conjugate gradient (CG) reconstruction procedure to the first intensity corrected combined image.

12. The method of claim 11, where the CG reconstruction procedure includes:
producing a CG image by performing a CG reconstruction method on the first intensity corrected combined image;
   producing two or more updated CG images by multiplying two or more sensitivity maps by the CG image;
   producing an updated k-space data in two or more rescaled matrices by Fourier transforming the updated CG images;
   selectively retaining data in the rescaled matrices based, at least in part, on the existence of a correlation between a data point in the updated k-space data and a data point in the k-space data;
   selectively clearing data in the rescaled matrices based, at least in part, on the absence of a correlation between a data point in the updated k-space data and a data point in the k-space data;
   producing two or more first reconstructed images by inverse Fourier transforming the rescaled matrices;
   extracting two or more second reconstructed images from central regions in the first reconstructed images;
   producing a combined second reconstructed image by combining the two or more second reconstructed images;
   producing a second intensity corrected image by intensity correcting the combined second reconstructed image; and
   selectively providing the second intensity corrected image to the CG reconstruction method as the first intensity corrected combined image until the second intensity corrected image converges to an image convergence threshold.

13. The method of claim 12 embodied as a set of computer executable instructions stored on a computer-readable medium.

14. A magnetic resonance imaging (MRI) apparatus, comprising:
   one or more basic field magnets controlled, at least in part, by a basic field magnet supply, the one or more basic field magnets being configured to produce a B0 field in which an object to be imaged can be placed;
   one or more gradient coils controlled, at least in part, by a gradient coils supply, the one or more gradient coils being configured to produce one or more gradient magnetic fields including one or more of GS, GP and GR, where the one or more gradient magnetic fields may be applied in the B0 field;
   one or more radio frequency (RF) antennas controlled, at least in part, by an RF transmission/reception unit, the RF antennas being configured to generate one or more RF pulses and to receive one or more resulting MRI signals from the object in the B0 field;
   one or more computers configured to control, at least in part, the basic field magnet supply, the gradient coils supply, and the RF transmission/reception unit, the one or more computers also being configured to facilitate processing the one or more resulting MRI signals into an image; and
   a bunched phase encoding (BPE) acquisition logic configured to facilitate controlling one or more of the gradient coils to produce an oscillating phase encoding gradient that may be applied to the B0 field during a readout phase, the oscillating phase encoding gradient being configured to facilitate acquiring a k-space data from two or more phase encoding lines during a single readout phase.

15. The MRI apparatus of claim 14, where k-space trajectories produced by successive oscillating phase encoding gradients are separated by M/FOV, M being a real number greater than 1.0, FOV being a field of view of an image to be reconstructed from the k-space data.

16. The MRI apparatus of claim 15, the oscillating phase encoding gradient being configured to facilitate acquiring the k-space data in X bunched samples, X being an integer greater than 1, and to acquire the k-space data at least at a rate of 1/X of the Nyquist rate in the phase encoding direction of the Fourier domain, and where members of the X bunched samples are spaced a distance a apart, a being grater than 0.

17. The MRI apparatus of claim 16, including a BPE reconstruction logic configured to facilitate reconstructing an image from the k-space data, the image being free of aliasing artifacts related to the Nyquist data sampling threshold not being satisfied, where the reconstructing includes:
   performing an inverse Fourier transform (IFT) on the k-space data to produce a first reconstructed data; and
   decomposing the first reconstructed data using a matrix inversion in which a matrix is constructed based, at least in part, on a positional shift associated with the k-space data.

18. The MRI apparatus of claim 16, the BPE acquisition logic being configured to facilitate acquiring the k-space data in parallel according to a sensitivity encoding (SENSE) methodology; and
   the BPE reconstruction logic being configured to facilitate reconstructing an image from the k-space data, where the reconstructing includes distributing the k-space data to two or more rescaled matrices, does not include computing a gridding co-efficient, and does not include gridding, and where the image is free of aliasing artifacts related to the Nyquist data sampling threshold not being satisfied.

19. A system, comprising:
   means for producing an oscillating phase encoding gradient in a B0 field produced by an MRI apparatus during a readout phase, the oscillating phase encoding gradient being configured to facilitate acquiring k-space data from two or more phase encoding lines during a single readout phase; and
   means for reconstructing an image from the k-space data acquired from the two or more phase encoding lines.

* * * * *